(12) United States Patent
Oh et al.

(10) Patent No.: US 8,036,043 B2
(45) Date of Patent: Oct. 11, 2011

(54) NONVOLATILE SEMICONDUCTOR DEVICE AND MEMORY SYSTEM INCLUDING THE SAME

(75) Inventors: Dong-Yean Oh, Seoul (KR); Woon-Kyung Lee, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 113 days.

(21) Appl. No.: 12/480,352

(22) Filed: Jun. 8, 2009

(65) Prior Publication Data

US 2010/0020617 A1    Jan. 28, 2010

(30) Foreign Application Priority Data

Jul. 24, 2008    (KR) .................. 10-2008-0072315

(51) Int. Cl.
*G11C 16/06* (2006.01)
(52) U.S. Cl. ......... 365/185.23; 365/185.03; 365/185.17; 365/185.18; 365/185.29; 365/185.33
(58) Field of Classification Search ............. 365/185.23, 365/185.03, 185.17, 185.18, 185.29, 185.33
See application file for complete search history.

(56) References Cited

U.S. PATENT DOCUMENTS

| | | | | |
|---|---|---|---|---|
| 5,677,556 A * | 10/1997 | Endoh | ................... | 257/316 |
| 6,118,696 A * | 9/2000 | Choi | ................... | 365/185.11 |
| 6,385,088 B1 * | 5/2002 | Arakawa et al. | ......... | 365/185.16 |
| 7,332,766 B2 * | 2/2008 | Hasegawa et al. | ........... | 257/315 |
| 7,457,156 B2 * | 11/2008 | Nazarian | ................. | 365/185.03 |
| 7,848,145 B2 * | 12/2010 | Mokhlesi et al. | ........ | 365/185.17 |
| 2007/0252201 A1 | 11/2007 | Kito et al. | | |
| 2008/0031048 A1 | 2/2008 | Jeong et al. | | |
| 2008/0067554 A1 | 3/2008 | Jeong et al. | | |

FOREIGN PATENT DOCUMENTS

| | | |
|---|---|---|
| JP | 2007-317874 | 12/2007 |
| KR | 1020080012667 | 2/2008 |
| KR | 1020080024971 | 3/2008 |

* cited by examiner

*Primary Examiner* — Connie Yoha
(74) *Attorney, Agent, or Firm* — F. Chau & Associates, LLC

(57) ABSTRACT

A nonvolatile semiconductor memory device including a vertical array structure comprised of bit lines and source lines arranged in the same direction as the bit lines, each source lines corresponding to the bit lines and memory cell strings vertically formed between each pair of the bit lines and source lines. Multiple strings of memory cells can be stacked in the vertical direction, and adjacent memory cell strings may share bit line or source line.

17 Claims, 23 Drawing Sheets

NONVOLATILE SEMICONDUCTOR DEVICE AND MEMORY SYSTEM INCLUDING THE SAME

CROSS-REFERENCE TO RELATED APPLICATIONS

This U.S. non-provisional patent application claims priority, under 35 U.S.C. §119, of Korean Patent Application No. 10-2008-72315 filed on Jul. 24, 2008, the entire contents of which are incorporated by reference.

BACKGROUND

1. Technical Field of the Invention

The present invention disclosed herein relates to semiconductor memory devices and more particularly, to nonvolatile semiconductor memory devices.

2. Description of the Related Art

Flash memory devices are kinds of nonvolatile memories capable of keeping data stored therein even without power supply. With a rapid increase of mobile apparatuses such as cellular phones, personal digital assistants (PDA), digital cameras, portable gaming consoles, and MP3, flash memory devices are widely employed for executable code storage, as well as for data storage. Flash memory devices may be also utilized in home applications such as high-definition televisions, digital versatile disks (DVDs), routers, and global positioning systems (GPS). The development of technologies for fabricating smaller but high circuit-density semiconductor chips for use in the above electronic devices also increased the need for higher density memories. A variety of methods for enhancing the integration density of memories have been proposed in the art. One of these methods is to make a memory device in a three-dimensional array structure (hereinafter, referred to '3-dimensional memory device' or 'vertical' array memory structure). Technical details for conventional 3-dimensional memory devices are disclosed in U.S. Pat. No. 5,835,396 (issued on Dec. 7, 1998) entitled "THREE-DIMENSIONAL READ-ONLY MEMORY"; U.S. Pat. No. 6,034,882 (issued on Mar. 7, 2000) entitled "VERTICALLY STACKED FIELD PROGRAMMABLE NONVOLATILE MEMORY AND METHOD OF FABRICATION"; and U.S. Pat. No. 7,002,825 (issued on Feb. 21, 2006) entitled "WORD LINE ARRANGEMENT HAVING SEGMENTED WORD LINES", and U.S. Patent Publication No. 2007-0252201 entitled "NONVOLATLE SEMICONDUCTOR MEMORY DEVICE AND MANUFACTURING METHOD THEREOF", all of which are incorporated by reference herein.

SUMMARY

A nonvolatile semiconductor memory device according to an exemplary embodiment of the invention may include a vertical array structure comprised of bit lines and source lines arranged in the same direction as the bit lines, each source lines corresponding to the bit lines and memory cell strings vertically formed between each pair of bit lines and source lines. Multiple layers of memory cell strings can be stacked in the vertical direction, and memory cell strings in vertically adjacent string layers may share bit lines or source lines.

An aspect of the present invention provides a vertical array memory structure comprised of: bit lines; a source line, each source line corresponding to one of the bit line, arranged in the same direction as the bit lines; and strings of memory cells vertically formed between each pair of the bit lines and source lines.

Another aspect of the present invention provides a nonvolatile semiconductor memory device comprised of: a vertical array including: bit lines, source lines corresponding each to the bit lines and arranged in the same direction with the bit lines, and memory cell strings vertically formed between each pair of the bit lines and source lines; and a reading/writing circuit configured to drive the bit and source lines in accordance with data to be stored during a programming operation. Each source line is driven with one of a program voltage or a program-inhibition voltage as same as the corresponding bit line.

A further understanding of the features of the present invention herein may be realized by reference to the remaining portions of the specification and the attached figures describing details of a nonvolatile memory device as an example for illustrating structural and operational features of the invention.

The present invention may, however, be embodied in different forms and should not be constructed as limited to the exemplary embodiments set forth herein. Rather, these exemplary embodiments are provided so that this disclosure will be thorough and complete, and will fully convey the scope of the present invention to those skilled in the art.

BRIEF DESCRIPTION OF THE FIGURES

Exemplary embodiments of the present invention will be described with reference to the following figures, wherein like reference numerals refer to like parts throughout the various figures unless otherwise specified. In the figures.

DETAILED DESCRIPTION OF EXEMPLARY EMBODIMENTS OF THE INVENTION

Figure 1:
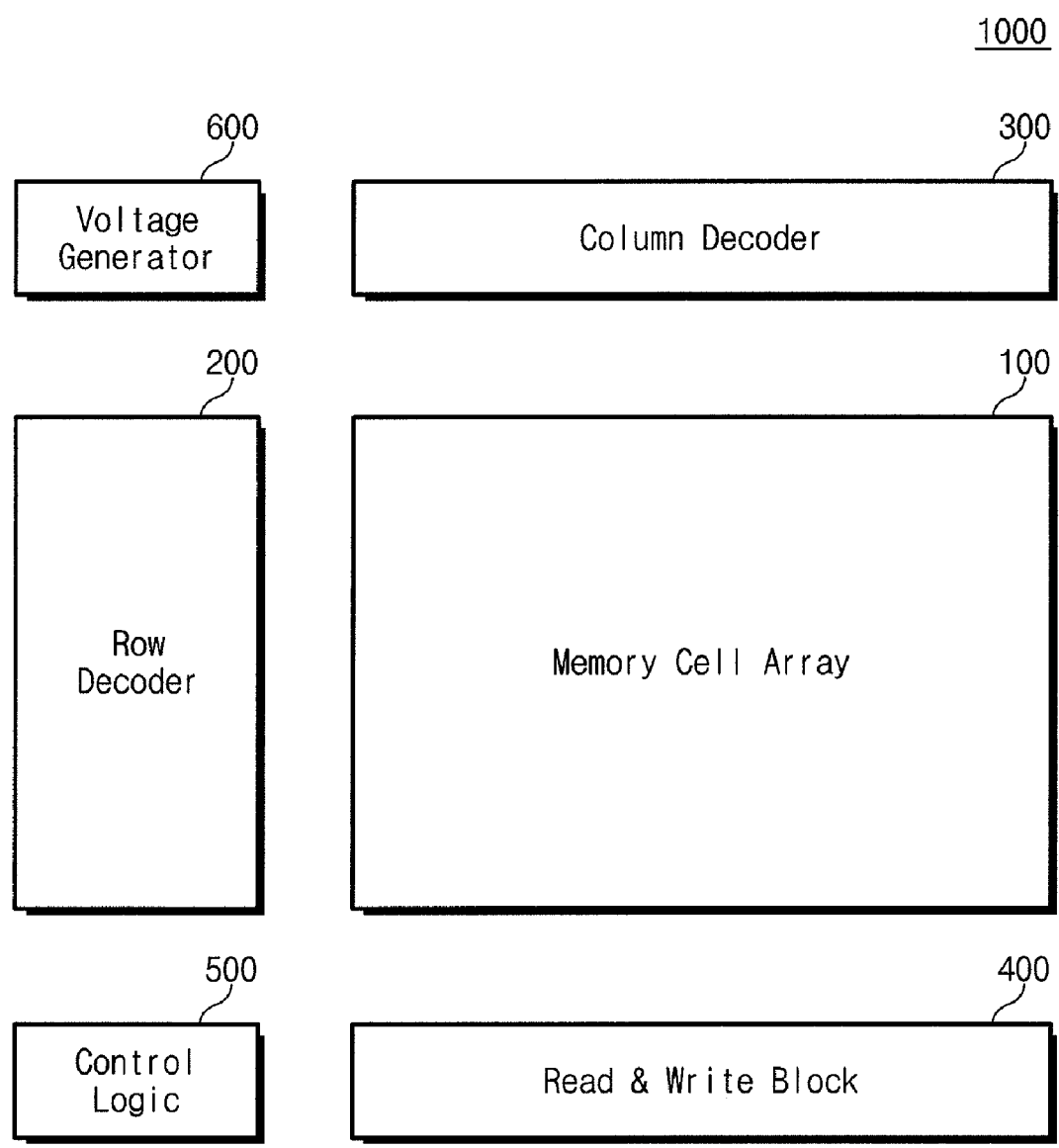
FIG. 1 is a block schematic of a nonvolatile semiconductor memory device according to various exemplary embodiments of the present invention.

FIG. 1 is a block schematic of a nonvolatile semiconductor memory device 1000 according to an exemplary embodiment of the present invention. As illustrated in FIG. 1, the nonvolatile semiconductor memory device 1000 according to the present invention is comprised of a memory cell array 100, a row decoder 200, a column decoder 300, a reading/writing circuit 400, a control logic circuit 500, and a voltage generator 600. The nonvolatile semiconductor memory device 1000 may be a flash memory device as an example, but the present invention is not limited thereto in respect to the kinds of memories that may be implemented as embodiments of the invention.

The memory cell array 100 includes a plurality of memory cells (not shown in FIG. 1, see FIG. 4) for storing information of N-bit data (N is 1 or a positive integer larger than 1). The memory cells are arranged at intersections of rows (or word lines) and columns (or bit lines). Each memory cell has a programmably variable characteristic. For instance, each memory cell may have a threshold voltage that varies based on a stored charge or each memory cell may have a variable resistance. However, it is understood by those skilled in the art that the programmable characteristic of a memory cell may is not limited to these examples.

The row decoder 200 operates in response to control signals from the control logic circuit 500, selecting a row of the memory cell array 100. The column decoder 300 operates in response to control signals from the control logic circuit 500, selecting a column of the memory cell array 100. The reading/writing block 400 operates in response to control signals from the control logic circuit 500, and is configured to read/write data from/into the memory cells in the array 100. The voltage generator 600 operates in response to control signals from the control logic circuit 500, generating various voltages at levels necessary for operations (e.g., reading, programming, and erasing operations).

Figure 2:
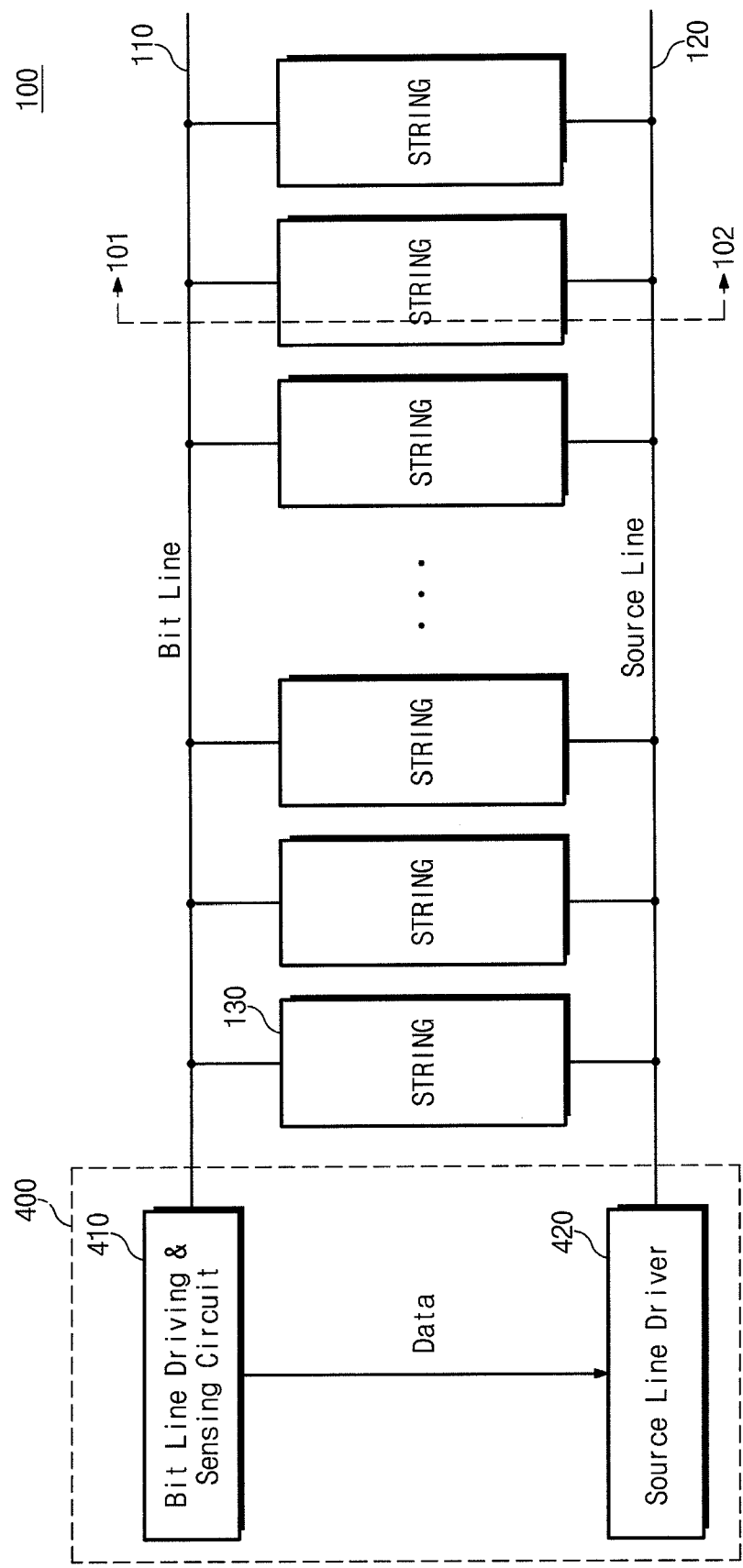
FIG. 2 is a block schematic diagram of a portion of the memory cell array 100 and the reading/writing block 400 shown in FIG. 1 implemented according to a first exemplary embodiment of the present invention.
Figure 3:
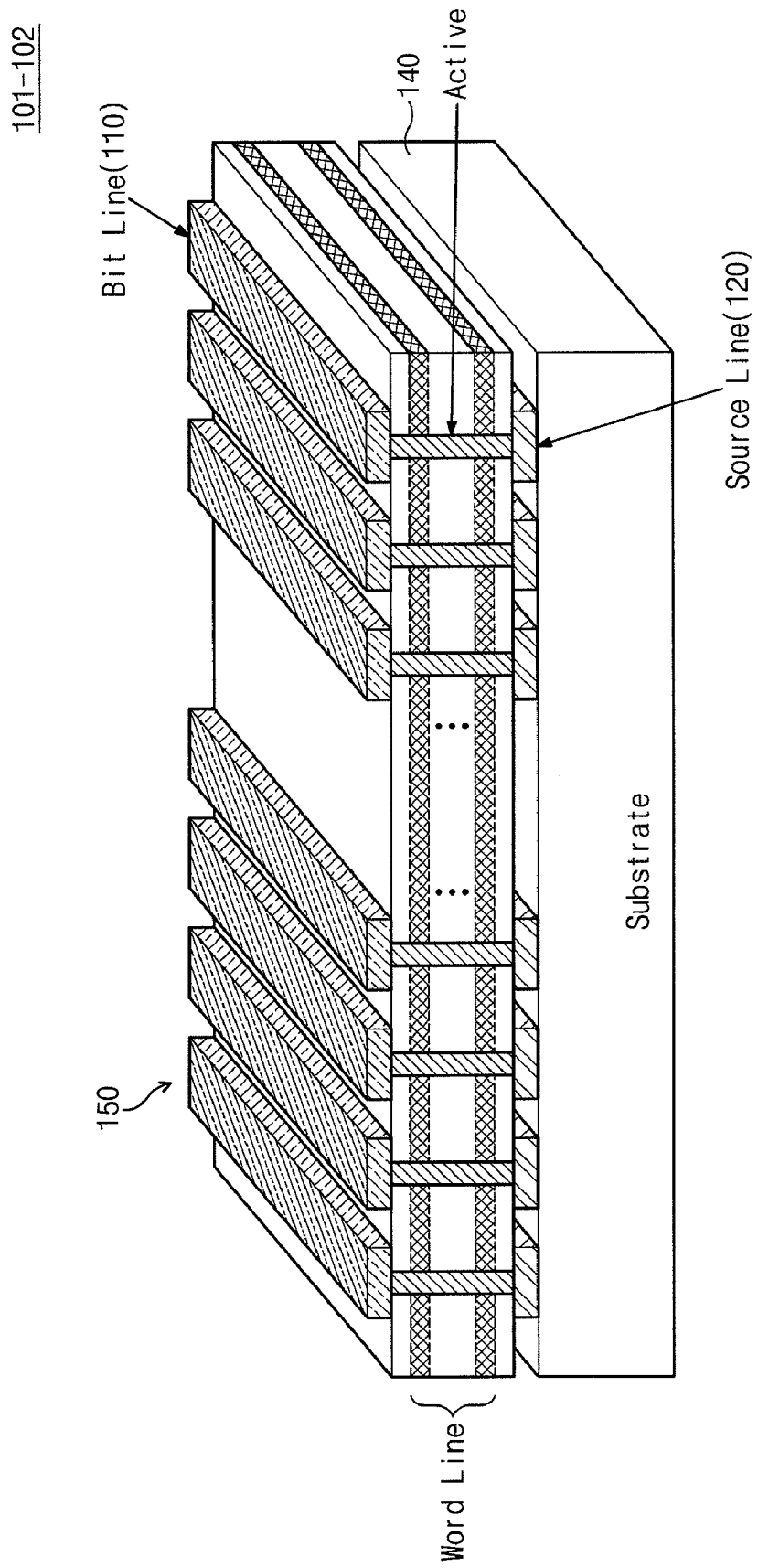
FIG. 3 is a cross-sectional view along the dotted section line 101-102 shown in FIG. 2.
Figure 4:
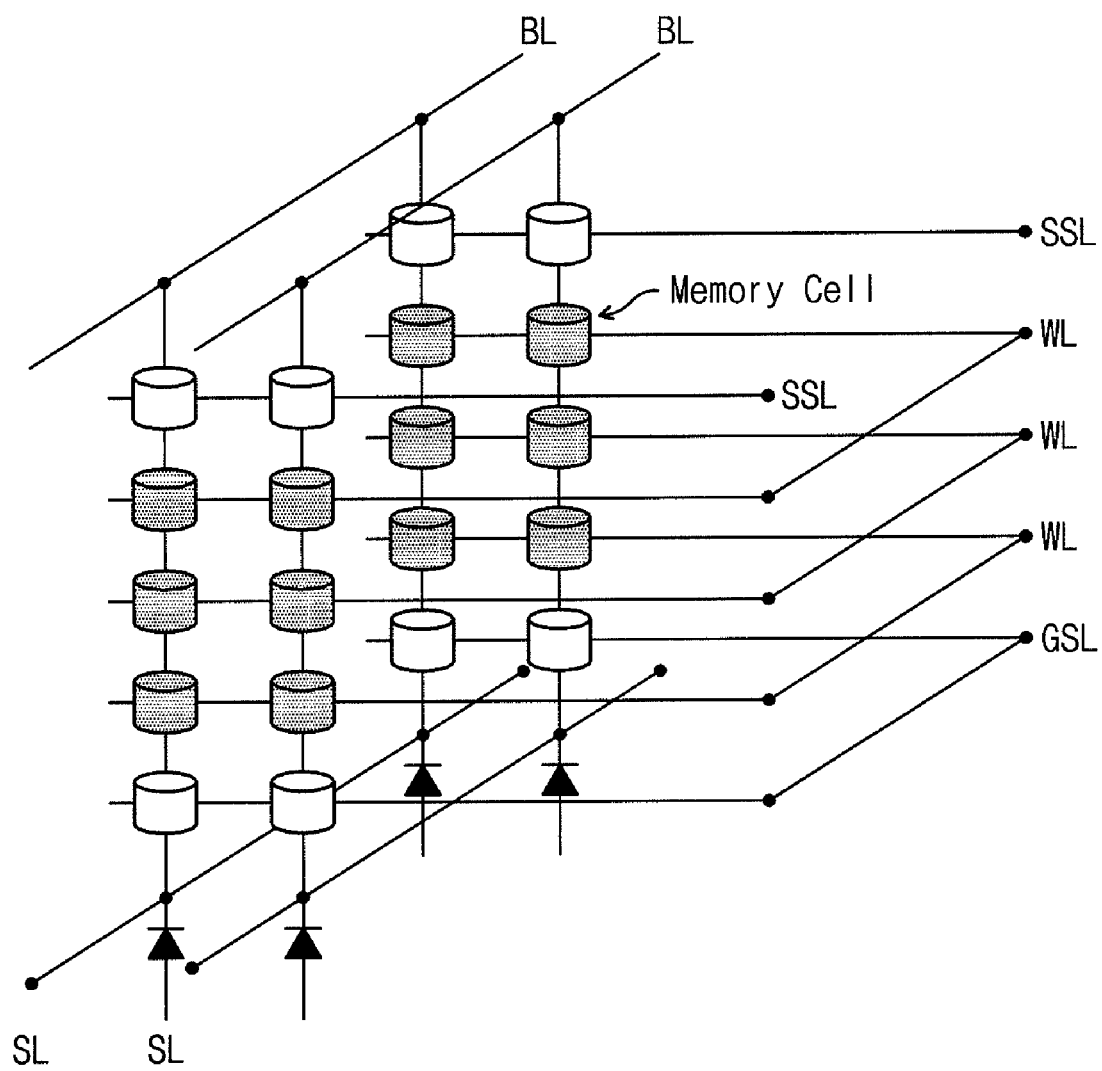
FIG. 4 is a schematic diagram illustrating the three-dimensional circuit structure of the memory cell array 100 shown in FIG. 3.

FIG. 2 is a block schematic diagram of a portion of the memory cell array 100 and the reading/writing block 400 shown in FIG. 1 by an exemplary embodiment of the present invention, and FIG. 3 is a cross-sectional view along the dotted section line 101-102 shown in FIG. 2. FIG. 4 is a schematic diagram illustrating the three-dimensional circuit structure of the memory cell array 100 shown in FIG. 3. For the sake of clarity in each illustration, FIG. 2 shows only components associated with a single bit line, FIG. 3 shows a cross section including a plurality of bit lines; and FIG. 4 shows components associated with two bit lines.

Each bit line (BL) 110 and a corresponding source line (SL) 120 are electrically connected to a pair of nodes/lines of the reading/writing block 400. Each bit line (BL) 110 is electrically connected to a bit line driving and sensing circuit 410 in the reading/writing block 400. Each source line (SL) 120 is electrically connected to a bit line driving and sensing circuit 420 in the reading/writing block 400. A plurality of memory cell strings 130 are vertically connected in parallel between each bit line (BL) 110 and the corresponding source line (SL) 120. The source lines 120 are arranged in the same direction (e.g., in parallel orientation) with the bit lines 110. In other words, the source line 120 is electrically connected to the same memory cell strings 130 that are coupled to the bit line 110. Referring to FIG. 3, the source lines 120 are electrically connected to their corresponding bit lines 110, respectively, through active regions forming the memory cell strings 130. The source lines 120 are electrically isolated from each other. Word lines WL are arranged perpendicular to the vertical active regions of the memory cell strings 130 and are arranged perpendicular to the bit lines 110 and the source lines 120. In the active regions of the NAND-flash memory cells, a tunnel oxide film and a charge storage layer are formed in sequence and a word line is used for a control gate of every memory cell connected to the given word line. The source lines 120 are made of N-type impurities or metals formed and patterned on a semiconductor substrate 140. The vertical array shown in FIG. 3 is illustrated in an equivalent circuit diagram in FIG. 4.

Figure 5:
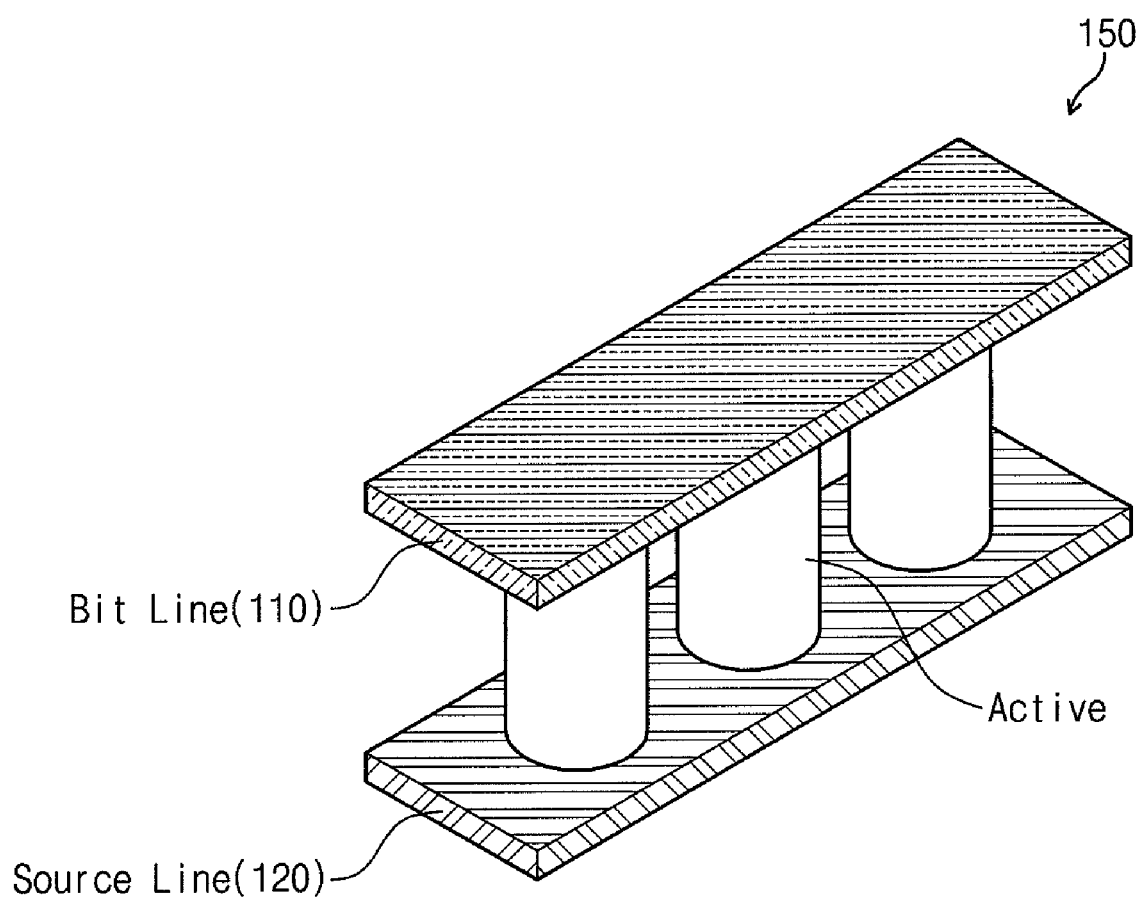
FIG. 5 partly illustrates a solid feature of the vertical array structure shown in FIG. 3.

Referring to FIG. 4, the source lines SL are individually formed in the same direction as the bit lines BL. Additionally, as shown in FIG. 5, the source line 120 is wired along the same direction as the bit line 110 and is electrically connected to the bit line 110 through the active region (or string). According to this vertical array structure, the number of source lines 120 is the same as the number of bit lines 110 in the array.

Returning to FIG. 2, the bit line 110 is connected to a bit-line driving/sensing circuit 410 and the source line 120 is connected to a source-line driving circuit 420. The bit-line driving/sensing circuit 410 operates to activate the bit line 110 at a required voltage (e.g., power source voltage VCC or ground voltage GND) in accordance with data to be stored. Although not shown, the bit-line driving/sensing circuit 410 is configured to temporarily store data. For instance, the bit-line driving/sensing circuit 410 includes latches for temporarily storing data, in the amount M appropriate to the memory cell type (i.e., M-bit data where M is 1 or a positive integer larger than 1, per memory cell). But the bit-line driving/sensing circuit 410 may is not limited to this configuration. The bit-line driving/sensing circuit 410 is also configured to sense the voltage from the bit line 110 as data.

The source-line driving circuit 420 operates to drive the source line 120 with one of the power source voltage VCC or the ground voltage GND in accordance with data provided from the bit-line driving/sensing circuit 410 during the programming operation. For instance, when data '0' is provided as program data from the bit-line driving/sensing circuit 410, the source-line driving circuit 420 activates the source line 120 with the ground voltage. When data '1' is provided as program data from the bit-line driving/sensing circuit 410, the source-line driving circuit 420 activates the source line 120 with the power source voltage as a program-inhibition voltage.

During the programming operation, the source line 120 is driven into the same voltage as the bit line 110 in accordance with data stored in the bit-line driving/sensing circuit 410.

Figure 6:
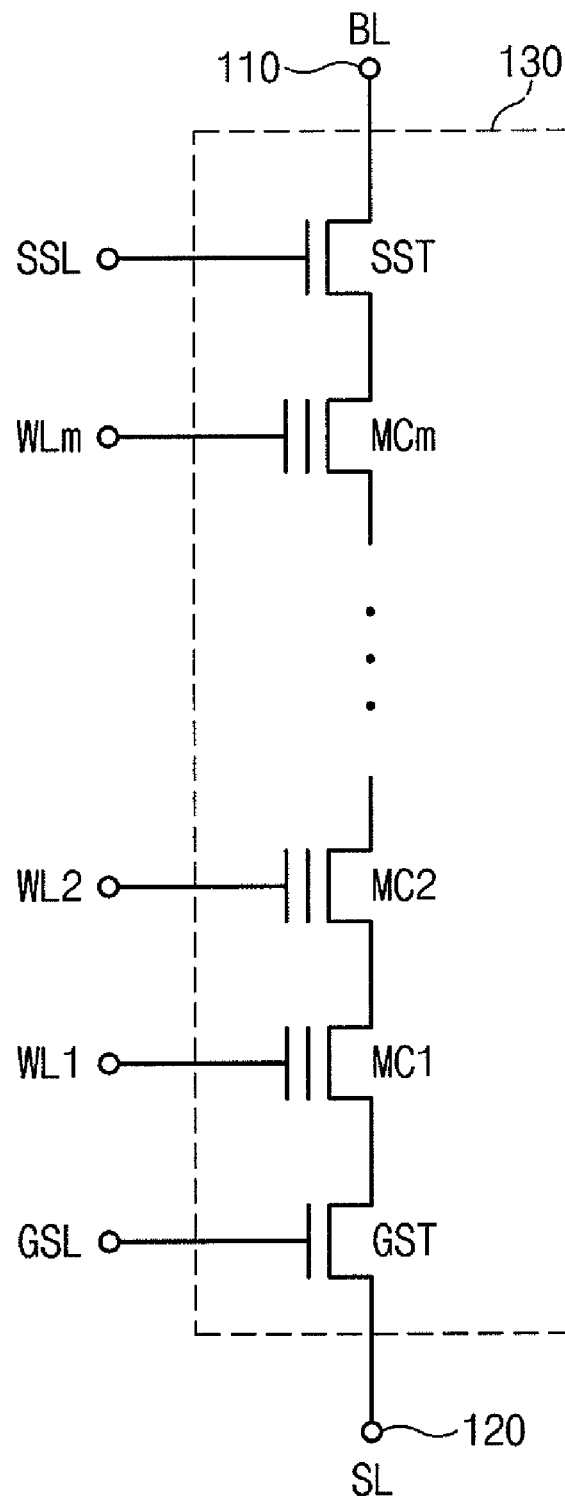
FIG. 6 is a circuit diagram illustrating one of the memory cell strings 130 shown in FIG. 2.

FIG. 6 is a circuit diagram illustrating one of the memory cell strings 130 shown in FIG. 2.

Referring to FIG. 6, the memory cell string 130 is connected between the bit line (BL) 110 and the source line (SL) 120, and includes a string selection transistor SST, a ground selection transistor GST, and m memory cells MC1~MCm serially connected between the selection transistors SST and GST. The string 130 is formed as a vertical structure, not a planar structure (or two-dimensional structure). The string selection transistor SST is coupled to a string selection line SSL and the ground selection transistor GST is coupled to a ground selection line GSL. The m memory cells MC1~MCm are coupled to their corresponding m word lines WL1~WLm. Although not shown in FIG. 6, the selection lines SSL and GSL and the m word lines WL1~WLm are driven by the row selector 200 shown in FIG. 1. The bit line 110 and the source line 120 are driven by the bit-line driving/sensing circuit 410 and the source-line driving circuit 420 (see FIG. 2), respectively. Driving schemes of the bit and source lines 110 and 120 will be described later.

In various embodiments, the memory cell strings commonly connected to a bit line are selected or deselected by activating selection transistors SST and GST belonging only to an arbitrary string. Thus, during each operation mode, only a selected string is electrically connected to each bit line.

Figure 7A:
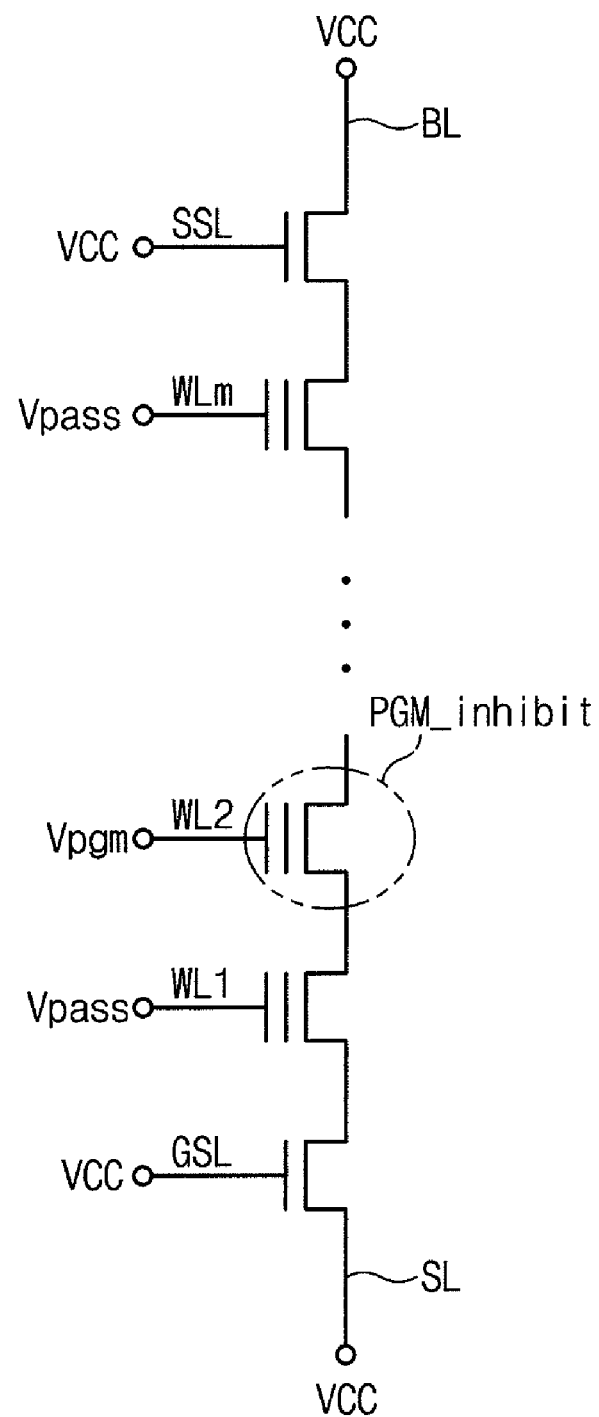
FIGS. 7A and 7B are circuit diagrams of a memory cell string 130 illustrating a programming operation of the nonvolatile semiconductor memory device of FIG. 2.
Figure 7B:
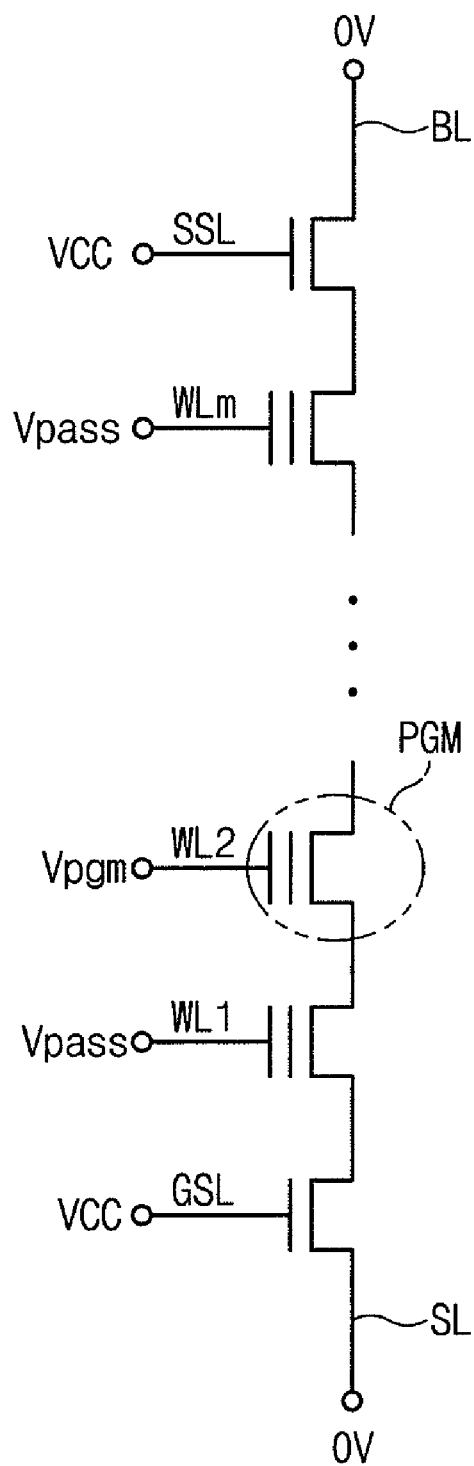
Figure 8:
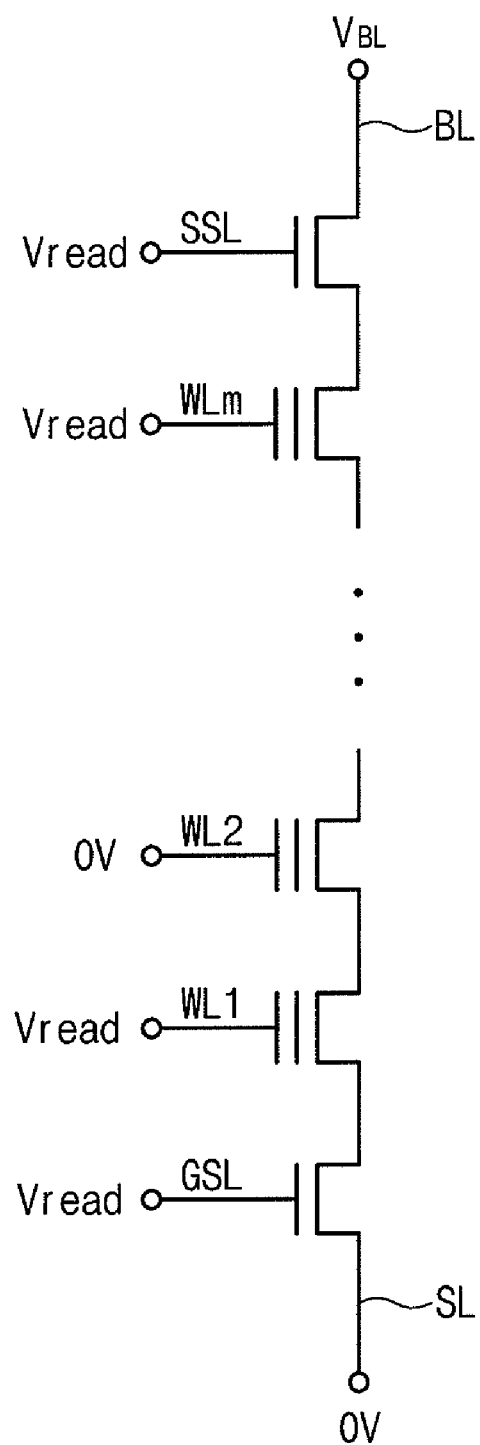
FIG. 8 is a circuit diagram illustrating a verify-reading operation of the nonvolatile semiconductor memory device of FIG. 2.
Figure 9A:
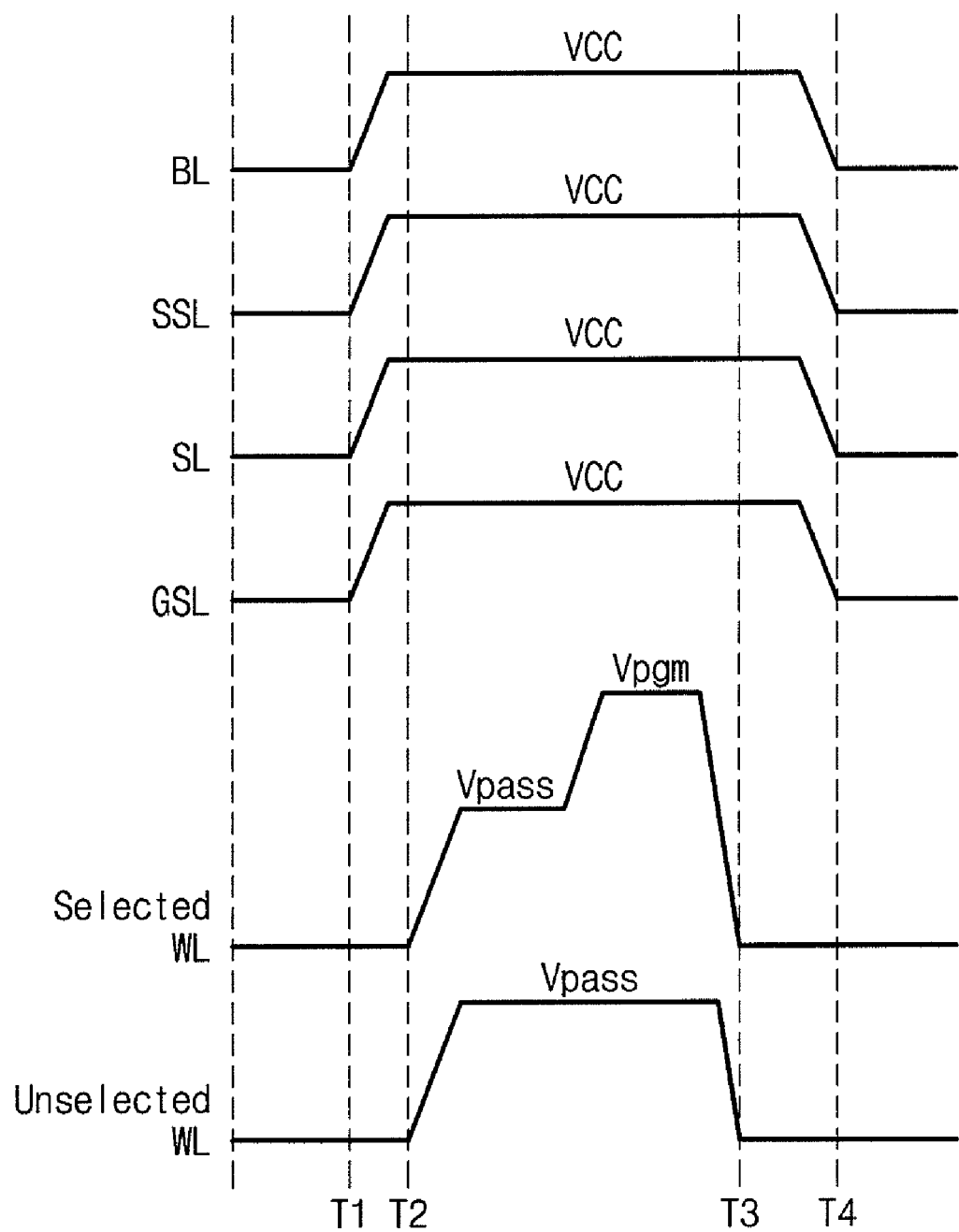
FIGS. 9A and 9B are waveform diagrams showing bias conditions during the programming operation of the nonvolatile semiconductor memory device of FIG. 2.
Figure 9B:
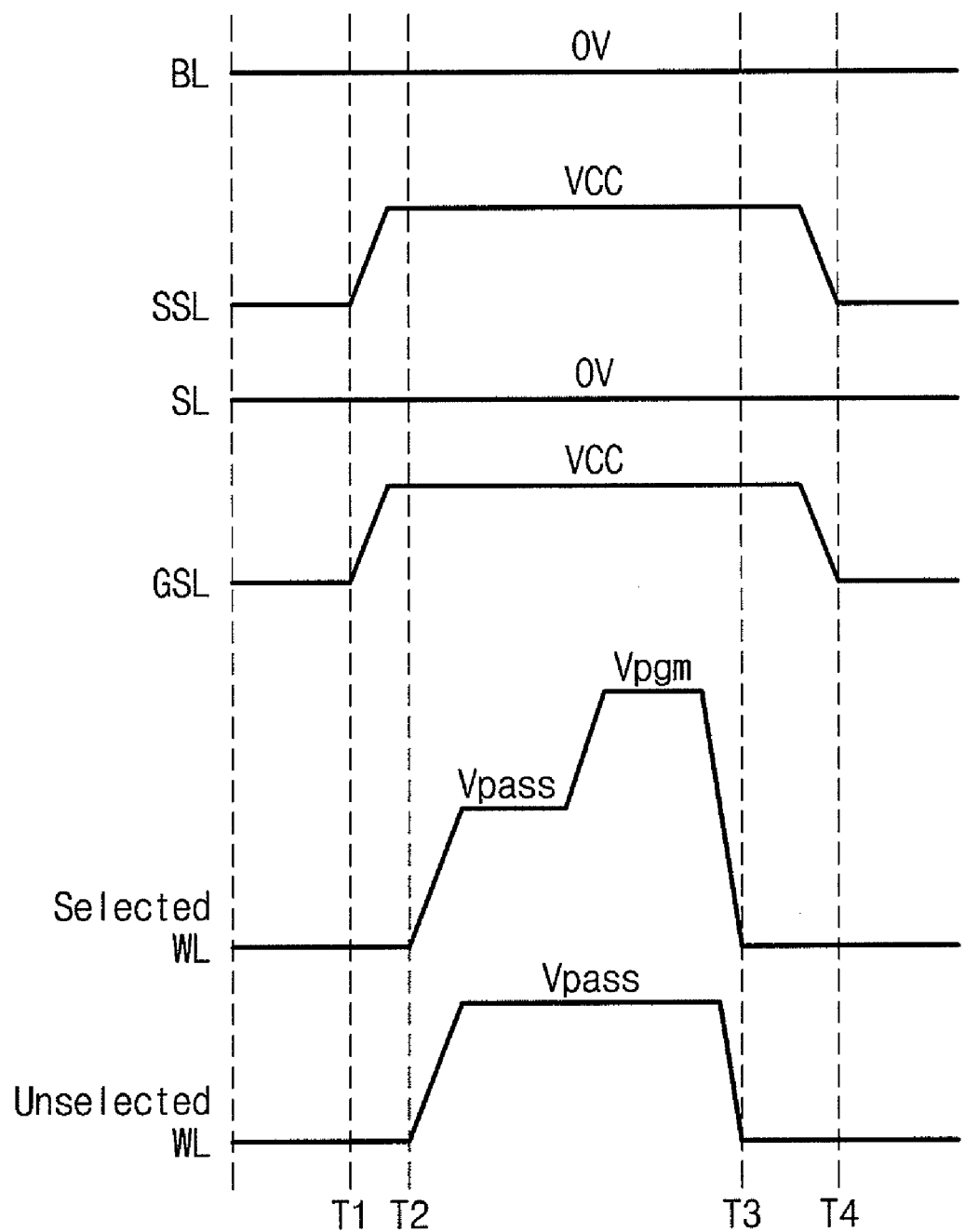

FIGS. 7A and 7B are circuit diagrams of a memory cell string 130 illustrating a programming operation of the nonvolatile semiconductor memory device of FIG. 1, and FIG. 8 is a circuit diagram of a memory cell string 130 illustrating a verify-reading operation of the nonvolatile semiconductor memory device of FIG. 1. FIGS. 9A and 9B are waveform diagrams showing bias conditions during the programming operations of the nonvolatile semiconductor memory device pf FIG. 1. Hereinafter the programming operation of the nonvolatile semiconductor memory device of FIG. 1 will be described in conjunction with these drawings.

As is well known, each programming operation may proceed by performing a plurality of programming loops. Each programming loop is composed of a precharging period, a programming period, and a verifying period. The programming loop will be repeated in the predetermined number of cycles until selected memory cells have been all program-passed. A program voltage increases by a predetermined increment while repeating the programming loops. In FIGs. the currently selected memory cells are supposed are labeled as being connected to WL2. The currently selected memory cells include the group of memory cells to be programmed and the other group of memory cells to be program-inhibited, based on data to be stored.

First, data to be stored in the memory cell array 100 is loaded into the reading/writing block 400 from an external. For example, the data to be stored is loaded into the bit-line driving/sensing circuit 410 of the reading/writing block 400.

Next, during a bit-line precharging period, the bit line BL is driven at the power source voltage or the ground voltage in accordance with data to be stored which is loaded into the bit-line driving/sensing circuit 410 while the selection lines SSL and GSL are being active on the power source voltage VCC. For instance, as shown in FIGS. 7A and 7B, the bit line BL is driven in the power source voltage VCC if a selected memory cell is to be program-inhibited. If a selected memory cell is to be programmed, the bit line is driven at the ground voltage (i.e., 0V). At the same time, the source line SL is driven on the power source voltage or the ground voltage by the source-line driving circuit 420 in accordance with data loaded into the bit-line driving/sensing circuit 410. In other words, the bit line BL and the source line SL are driven at the same voltage in accordance with data loaded into the bit-line driving/sensing circuit 410. This means that channel of the string 130 (i.e., channels of the memory cells of the string) are being precharged at both ends thereof though the bit and source lines BL and SL. This channel precharging scheme makes it possible to obtain a uniform channel potential, shortening the time for precharging the channel. Moreover, since the power source voltage VCC is applied to the ground selection transistor GST, it is effective in preventing hot-carrier program disturbance to adjacent memory cells due to gate-induced drain leakage from the ground selection transistor GST.

Once the channel of the string 130 is precharged, the channel of the string including a program-inhibited memory cell is in a floating state. In other words, as the channel of the string 130 driven with the power source voltage VCC is precharged by a voltage (e.g., VCC−Vth) and the selection lines SSL and GSL are driven on the power source voltage VCC, the channel of the string 130 is floated. During the programming period, the program voltage Vpgm is applied to a word line (e.g., WL2) coupled to a selected memory cell, while a pass voltage Vpass is applied to the unselected word lines (i.e., WL1 and WL3~WLm) coupled to unselected memory cells. Under this bias condition, memory cells coupled to the selected word line WL2 will be programmed or program-inhibited in accordance with their channel potentials (determined by self-boosting mechanisms).

In the verify-reading period, as shown in FIG. 8, 0V is applied to the selected word line WL2 while a read voltage Vread is applied to the selection lines SSL and GSL and to the unselected word lines WL1 and WL3~WLm. During this time, the source line SL is set on the ground voltage and the bit line BL is set on a bit line voltage $V_{BL}$. Unless the selected memory cell has programmed, the bit line BL decreases to the level of the ground voltage through the channel. However if the selected memory cell has been programmed, the bit line BL is maintained at the bit line voltage $V_{BL}$ or goes to the level of the power source voltage VCC. Then, the bit-line driving/sensing circuit 410 senses the voltage from the bit line BL as data and the sensed data is stored in the bit-line driving/sensing circuit. For instance, if the selected memory cell has been programmed, data '0' stored in the bit-line driving/sensing circuit 410 is changed to data '1'. Unless the selected memory cell has been programmed, data '0' stored in the bit-line driving/sensing circuit 410 is maintained without change.

The aforementioned operation, i.e., the programming loop, is repeated the predetermined number of times until memory cells of the selected word line are all programmed reliably. In the next programming loop, if data '0' is changed to data '1', the bit line BL is driven by the power source voltage VCC, during the precharging period, and the source line SL is also driven by the power source voltage through the source-line driving circuit 420. Otherwise, although not shown, the bit-line driving/sensing circuit 410 may be configured to be capable of directly driving the source line SL, as the bit line BL, without using a switch 430 of FIG. 11.

The signal timing of the programming operation of the memory device of FIG. 1 is shown in FIGS. 9A and 9B. As illustrated in FIGS. 9A and 9B, the bit and source lines BL and SL are driven by the same voltage. For instance, if data to be programmed (i.e., program data) is data '1', as illustrated in FIG. 9A, the bit and source lines BL and SL are driven on the power source voltage VCC. If program data is data '0', as illustrated in FIG. 9B, the bit and source lines BL and SL are driven on the ground voltage 0V. However, the present invention is not limited to the operation timing features of the bias voltages shown in FIGS. 9A and 9B.

Figure 10A:
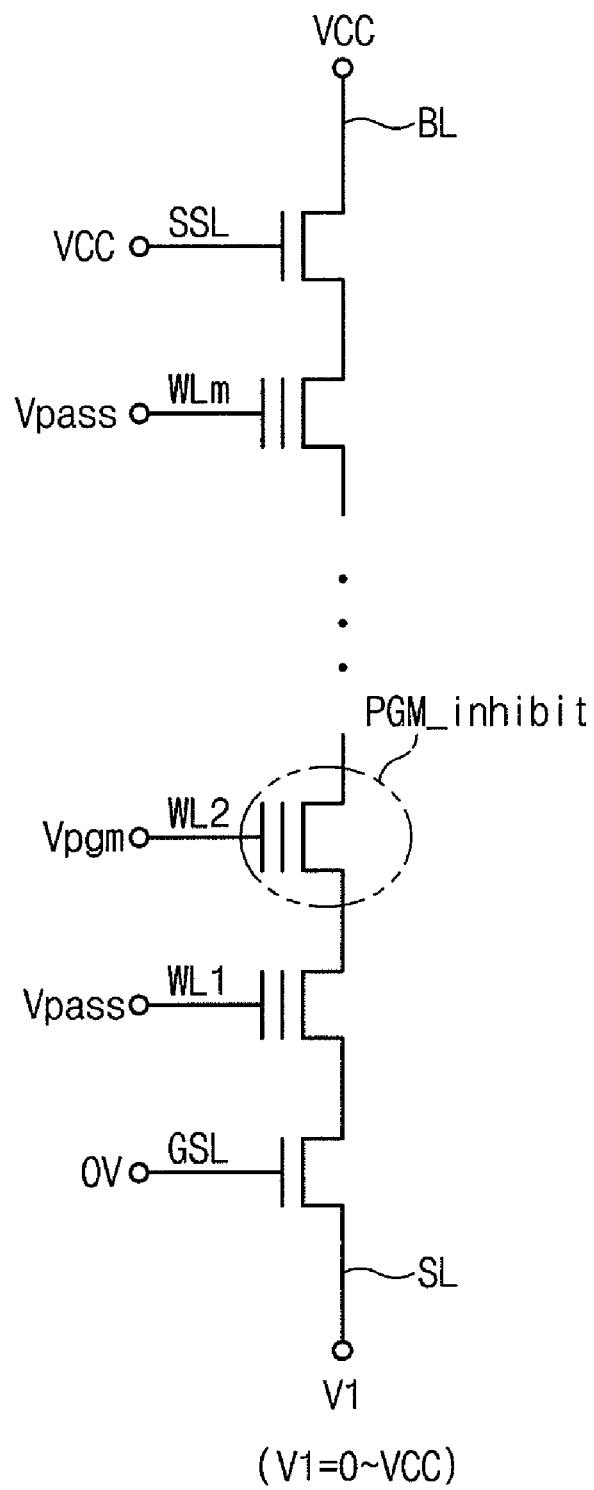
FIGS. 10A and 10B are circuit diagrams of a memory cell string 130 illustrating the programming operation of the nonvolatile semiconductor memory device of FIG. 2.
Figure 10B:
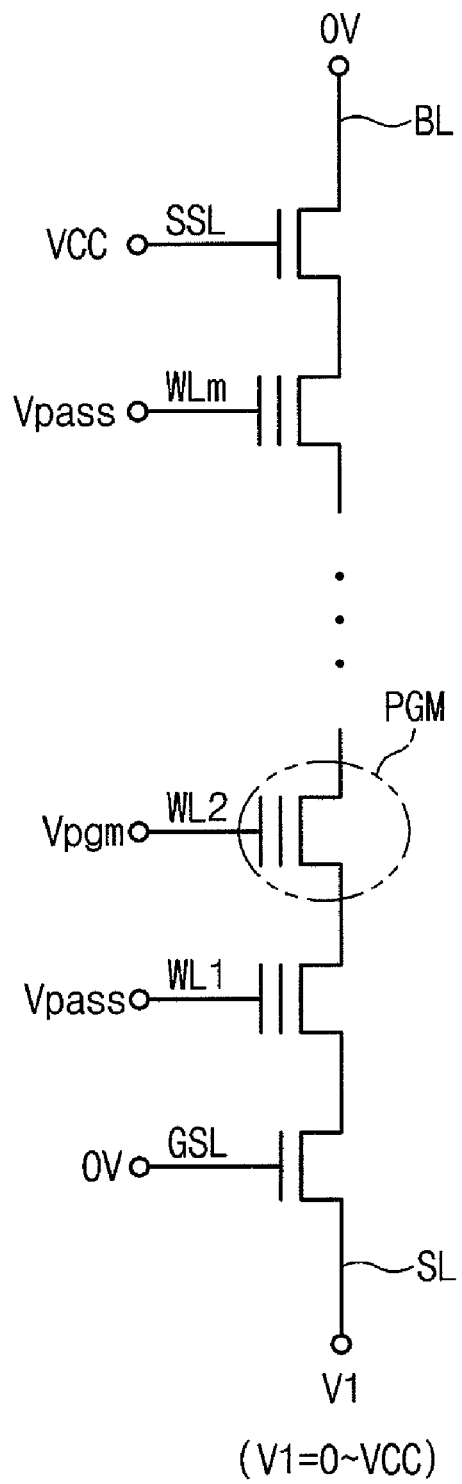

It is well known that a traditional structure where bit lines intersect source lines is inherently tied to a large amount of common source line (CSL) noise during the reading operation. In the disclosed array structure of the memory device of FIG. 1, in which the bit lines are parallel with the source lines, line noise is less than the CSL noise in the traditional structure. For that reason, as shown in FIGS. 10A and 10B, it is possible to precharge the string simply through the bit line BL in the situation that the source line is driven on a predetermined voltage (V1=0V~VCC).

The bias conditions for the operations of the flash memory device in accordance with this exemplary embodiment of the present invention are summarized in Table 1 as follows:

TABLE 1

|  | READ | WRITE '0' | WRITE '1' | ERASE (selected block) | ERASE (unselected block) |
| --- | --- | --- | --- | --- | --- |
| BL | Vbl | 0 V | VCC | Verase | Verase |
| SSL | Vread | VCC | VCC | Vss1 = Verase-a | Vss1 = Verase-a |
| Selected WL | 0 V | Vpgm | Vpgm | 0 V | Floating |
| Unselected WLs | Vread | Vpass | Vpass | 0 V | Floating |
| GSL | 0 V | VCC | VCC | Vgs1 = Verase-a | Vgs1 = Verase-a |
| SL | 0 V | 0 V | VCC | Floating (or Vrease) | Floating (or Verase) |
| PW | 0 V | 0 V | 0 V | Verase | Verase |

The reading, writing, and erasing operations of the present invention are not limited to the exemplary voltages listed in Table 1.

Figure 11:
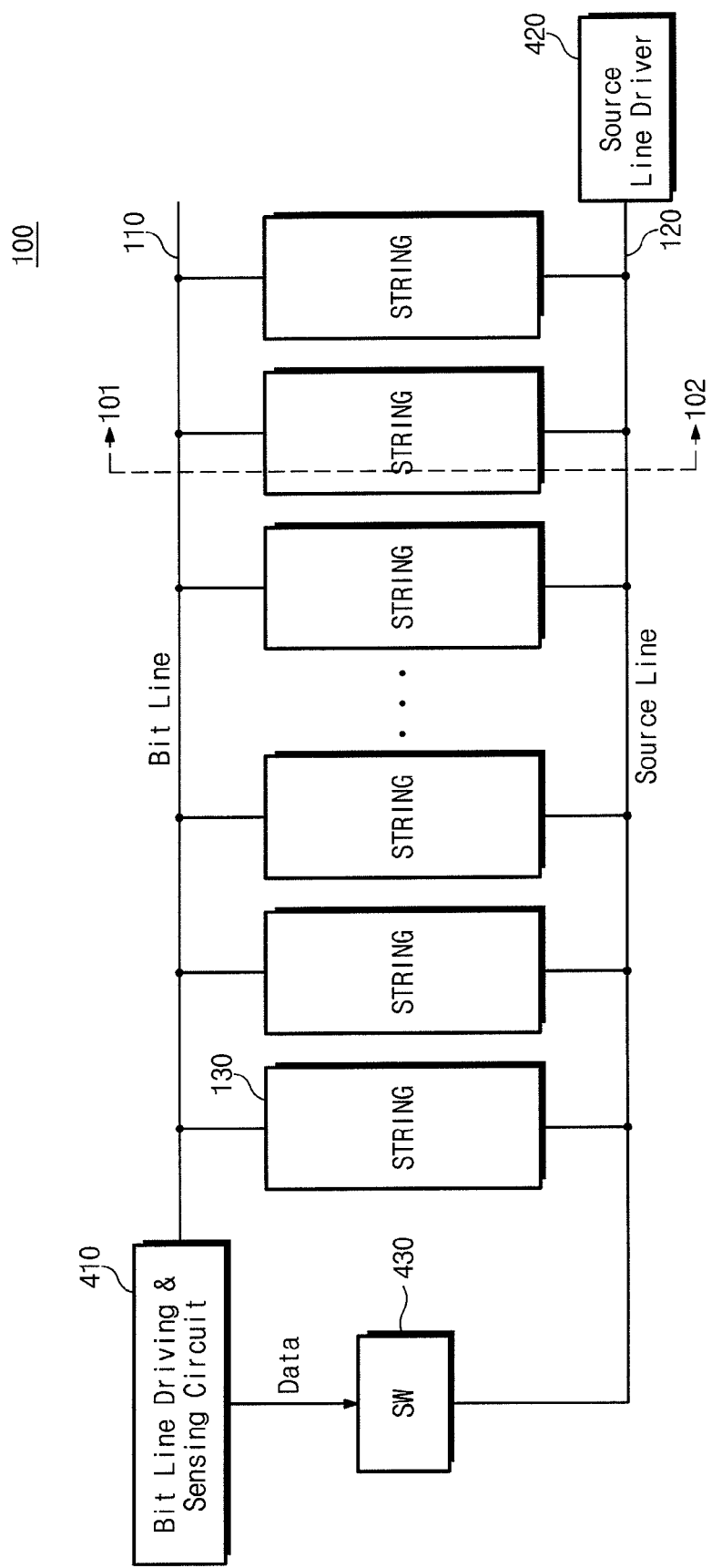
FIG. 11 is a block schematic diagram of a portion of the memory cell array 100 and the reading/writing block shown in FIG. 1 implemented according to another exemplary embodiment of the present invention.

FIG. 11 is a block schematic diagram of a portion of the memory cell array 100 and the reading/writing block 400 shown in FIG. 1 implemented according to another exemplary embodiment of the present invention.

Referring to FIG. 11, the source line SL can be driven by the bit-line driving/sensing circuit 410 or the source-line driving circuit 420 in accordance with an operational mode. For instance, the source line SL is driven by the bit-line driving/sensing circuit 410 through the switch 430 in the programming operation, but by the source-line driving circuit 420 during the reading/erasing operations.

Figure 12:
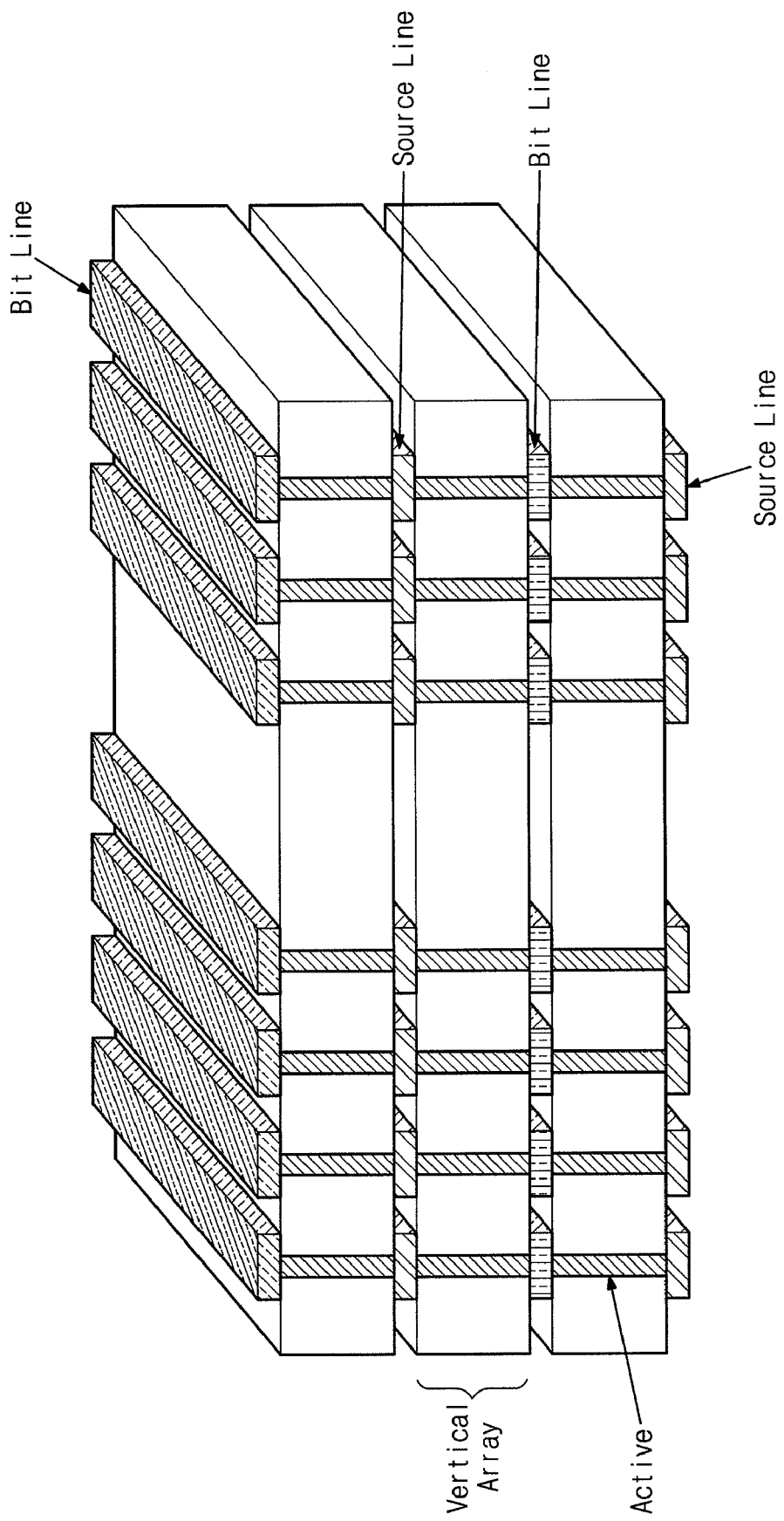
FIG. 12 is a solid schematic showing a vertical array structure in the memory cell array 100 of FIG. 11.

FIG. 12 is a cross sectional view showing the vertical array structure according to another exemplary embodiment of the present invention.

Referring to FIG. 12, a plurality of vertical arrays in the same structure shown in FIG. 3 can be stacked to form plural layers of arrays. According to this vertical array structure, the bit and source lines are shared by the arrays of adjacent layers. This vertical array architecture of the present invention and disclosed herein may be useful to forming active regions to constitute the memory cell strings.

Figure 13:
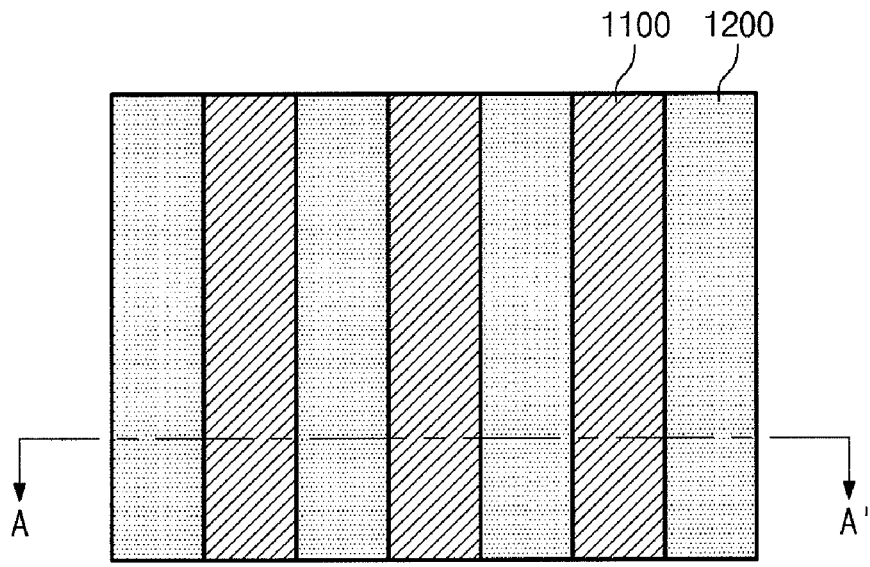
FIG. 13 is a plane view showing an arrangement of source lines in the array architecture in the memory cell array 100 of FIG. 11.
Figure 14:
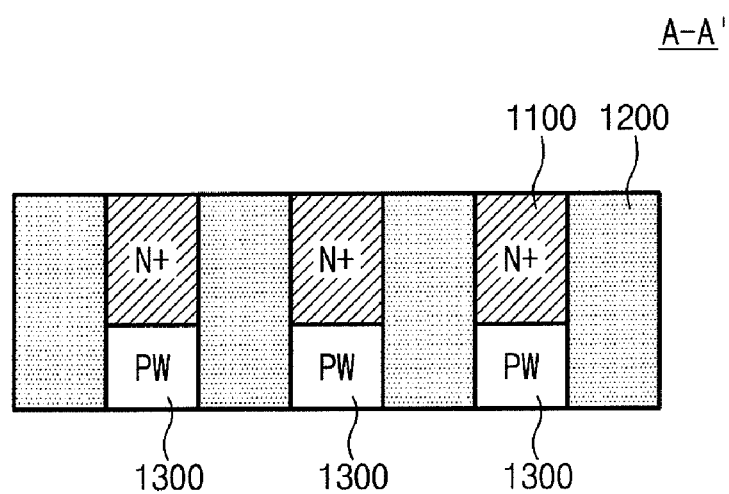
FIG. 14 is a cross sectional view along the solid section line A-A' of FIG. 13.

FIG. 13 is a plane view showing an arrangement of source lines by the array architecture according to the present invention, and FIG. 14 is a cross section along the solid section line A-A' of FIG. 13. FIGS. 15A through 15D are cross sections illustrating steps in a process for fabricating the source lines in the memory cell array 100 according to an exemplary embodiment of the present invention.

Referring to FIG. 13, the source lines 110 are arranged in parallel (or in the same direction) with the bit lines (although bit lines are not shown in FIG. 13). The source lines 1100 are electrically isolated from each other by insulation (or dielectric) material layers 1200. Referring to FIG. 14, the source lines 1100 are formed on a semiconductor substrate 1300 (see FIG. 15A) and electrically isolated to each other through the insulation material layers 1200.

A process for fabricating the source lines of this exemplary embodiment of the present invention is described below with reference to FIGS. 15A through 15D.

Figure 15A:
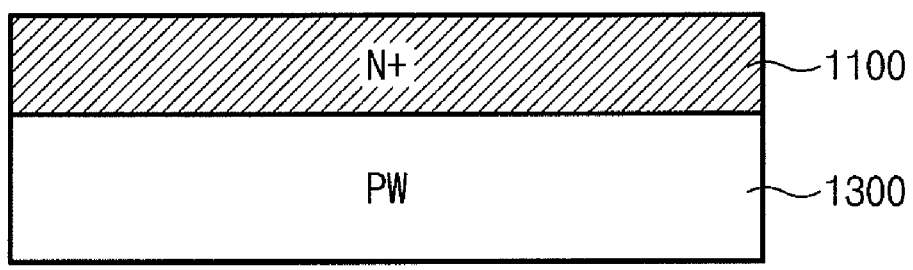
FIGS. 15A through 15D are cross sections illustrating steps in a process for fabricating the source lines in the memory cell array 100 according to an exemplary embodiment of the present invention.
Figure 15B:
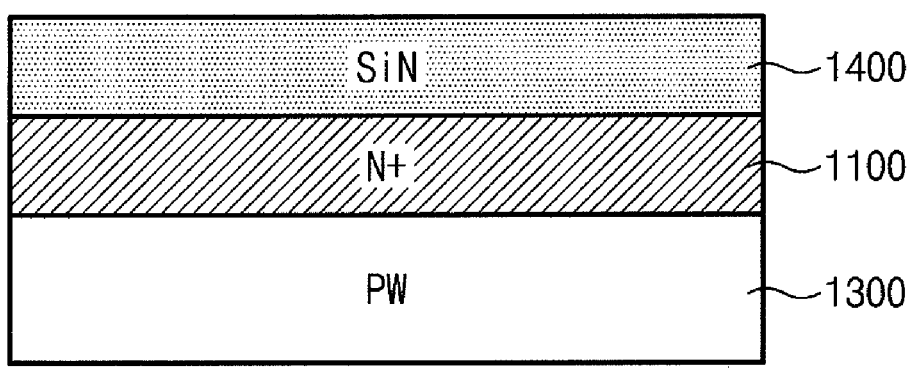
Figure 15C:
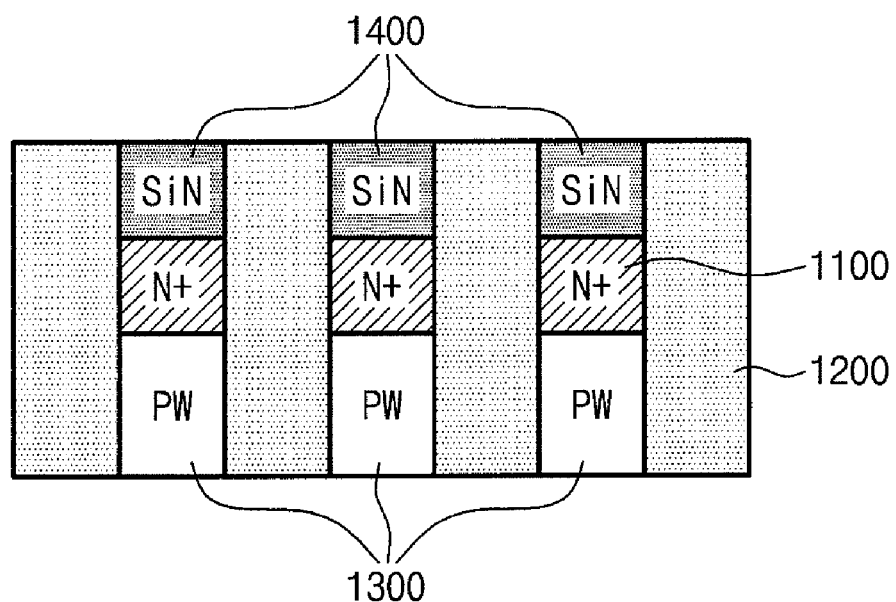
Figure 15D:
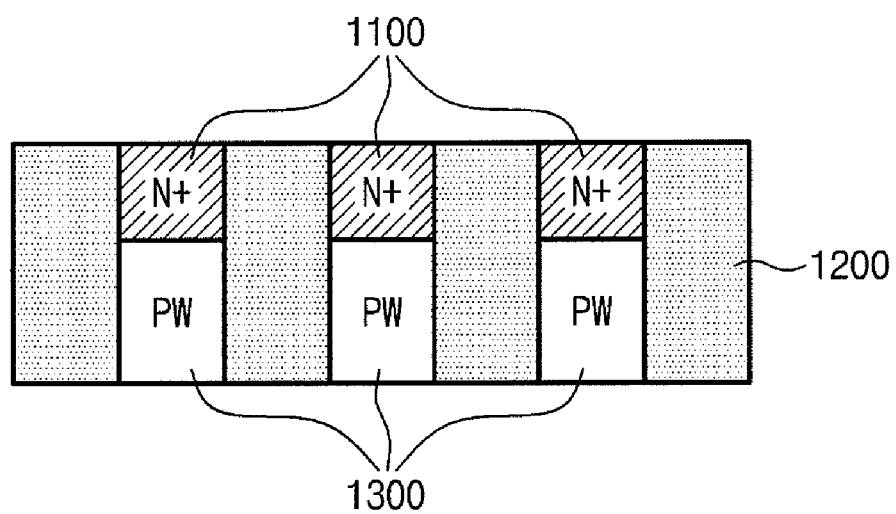

First, as shown in FIG. 15A, N+ ionic impurities 1100 are injected into the surface of the semiconductor substrate 1300. Next, referring to FIG. 15B, a nitride film 1400 such as SiN is formed on the surface of the N+ impurity region 1100. Then, as shown in FIG. 15C, a well-known shallow trench isolation (STI) and chemical-mechanical polishing (CMP) process is carried out to form N+ patterns that are electrically isolated from each other by an oxide material 1200. Here, the N+ patterns are used as the source lines according to exemplary embodiments of the present invention. Thus, the source lines are made of an N-type material 1100. Afterwards, the insulation nitride 1400 and STI oxide materials are removed therefrom as illustrated in FIG. 15D. The result is the source line structure as shown in FIG. 14.

Figure 16:
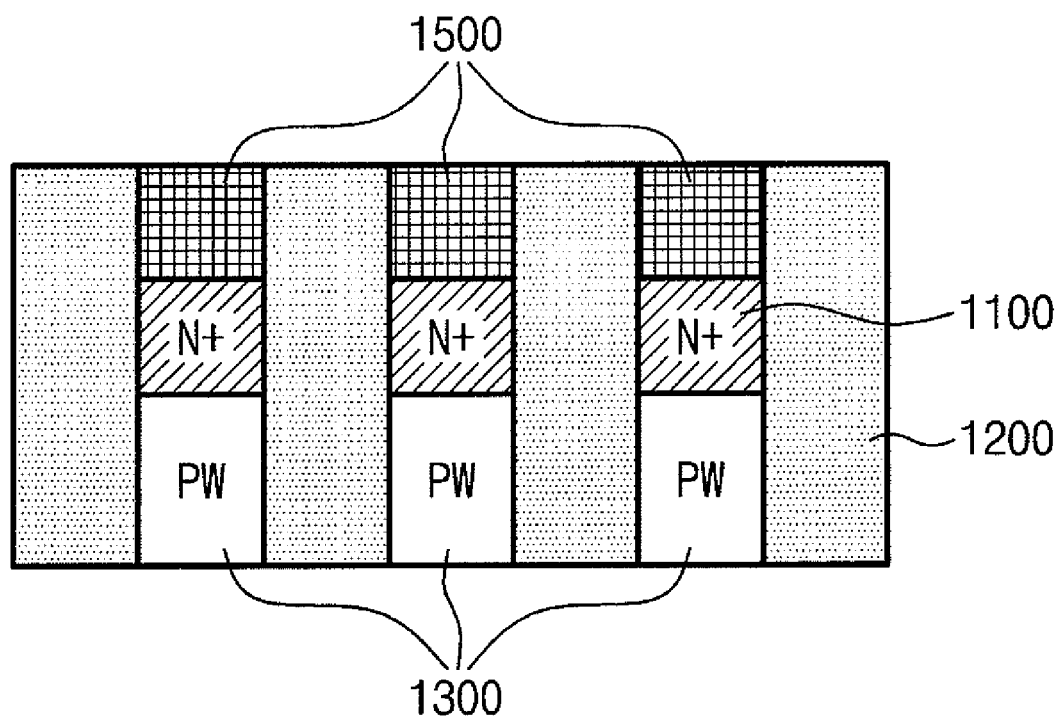
FIG. 16 is a cross section of a source line in the memory cell array 100 according to another embodiment of the present invention.
Figure 17A:
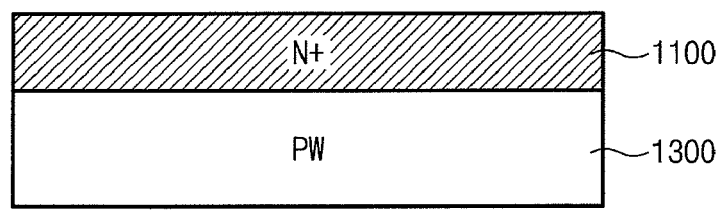
FIGS. 17A through 17E are cross sections illustrating steps in a process for fabricating the source line structure shown in FIG. 16.
Figure 17B:
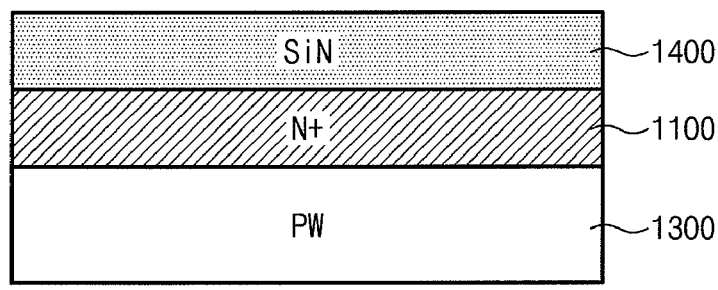
Figure 17C:
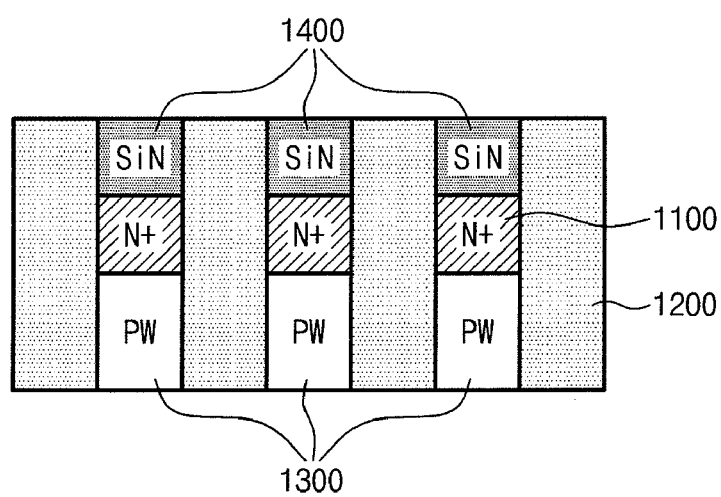
Figure 17D:
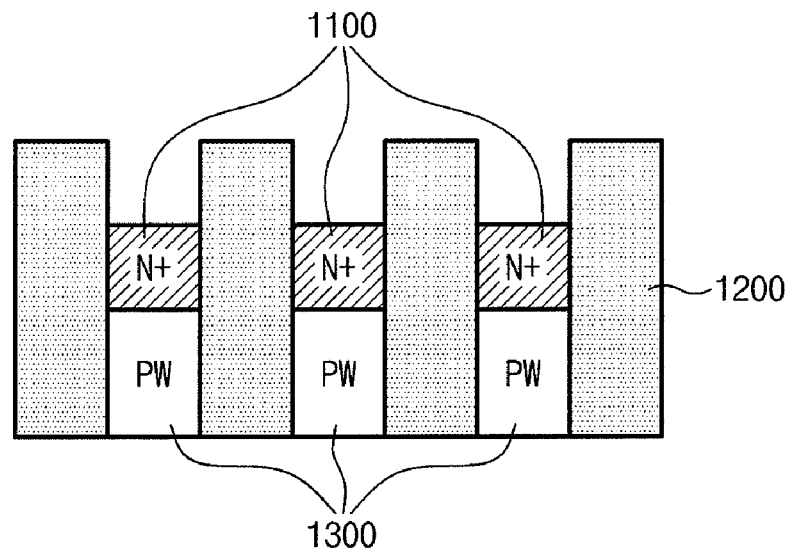
Figure 17E:
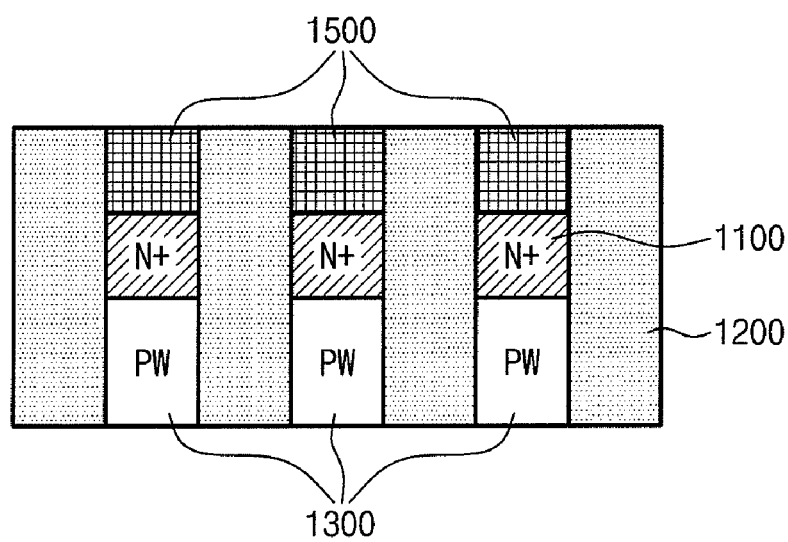

FIG. 16 is a cross section of the source line structure in the memory cell array 100 according to another exemplary embodiment of the present invention, and FIGS. 17A through 17E are cross sections illustrating steps in a process for fabricating the source line structure shown in FIG. 16. In FIGS. 16 and 17A through 17E, the lines that are formed by the same steps shown in FIG. 14 and FIGS. 15A through 15B are marked with the same reference numerals. The source line structure of FIG. 16 is practically same as that of FIG. 14, except that a metal 1500 is added to the N+ patterns 1100. In the structure shown in FIG. 16, the source lines are formed of a metal such as a metal salicide. The process for fabricating the source line structure of FIG. 16 will be described with reference to FIGS. 17A through 17E.

The processing manner shown in FIGS. 17A through 17E is substantially same as that shown in FIGS. 15A through 15C, so it will not be redundantly detailed. After completing the STI and CMP steps of FIG. 17C, the nitride 1400 of SiN is removed. Then, a metal is formed on the patterned N+ 1100 in between the STI oxide 1200. The result is the source line structure as shown in FIG. 16.

The method of forming the source lines is not limited to the exemplary steps illustrated in FIGS. 13 through 17E.

Figure 18:
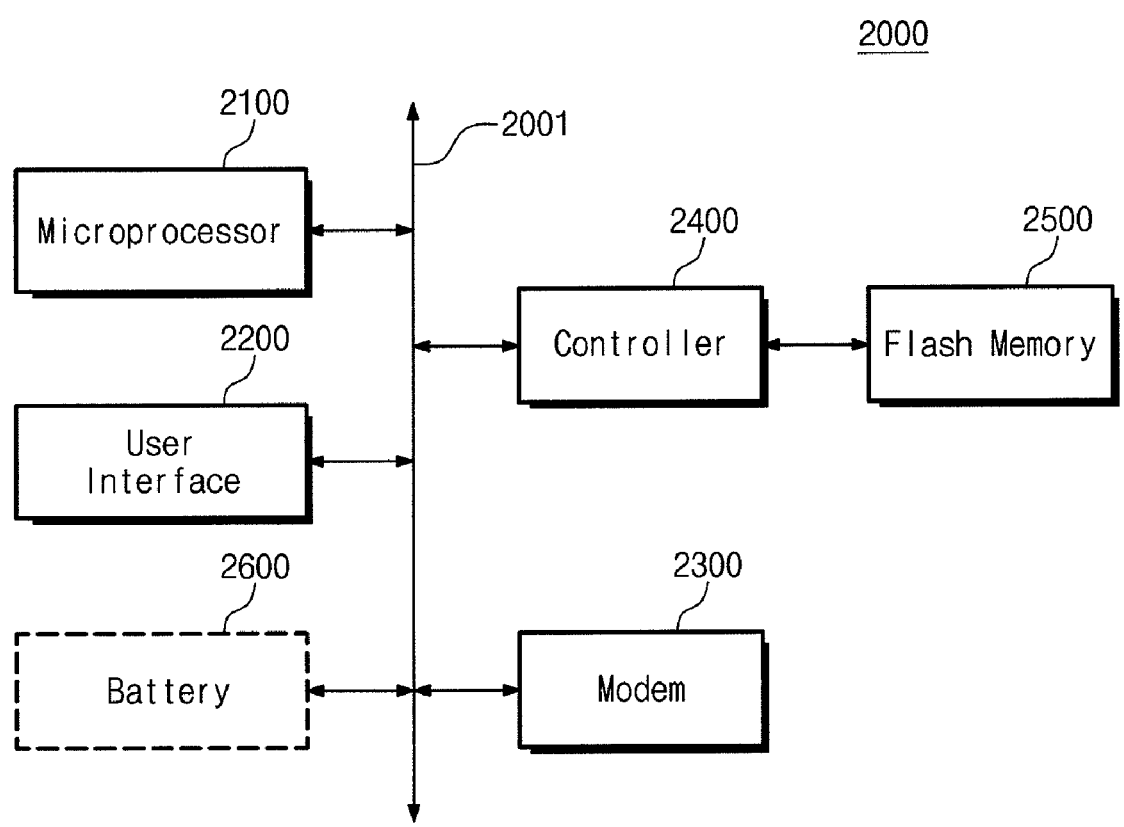
FIG. 18 is a block diagram of a computing system 2000 including the nonvolatile semiconductor memory device of FIG. 1.

FIG. 18 illustrates a computing system including a non-volatile semiconductor memory device according to the present invention. The computing system 2000 according to the present invention includes a microprocessor 2100, a user interface 2200, a modem 2300 such as a baseband chipset, a memory controller 2400, and a flash memory device 2500, all of which are electrically connected to a system bus 2001. The flash memory device 2500 may be configured substantially the same as that 1000 shown in FIG. 1. In the flash memory device 2500, N-bit wide data (N is a positive integer e.g., N=8, 16, or 64 bits) processed or to be processed by the microprocessor 2100 may be stored through the memory controller 2400. If the computing system 2000 shown in FIG. 18 is a mobile apparatus, it may further comprise of battery 2600 for supplying power thereto. Although not shown in FIG. 18, the computing system 2000 may be further equipped with an application chipset, a camera image processor (e.g., complementary metal-oxide-semiconductor (CMOS) image sensor; i.e., CIS), a mobile DRAM, and so forth. The memory controller 2400 and the flash memory device 2500, for example, may constitute an solid state disk (SSD) implemented using nonvolatile Flash memory cells. An example of SSD is disclosed in U.S. Patent Publication No. 2006-0152981, which is incorporated herein by reference. Further, the memory controller 2400 and the flash memory device 2500 can be integrated on a removable nonvolatile memory card.

Figure 19:
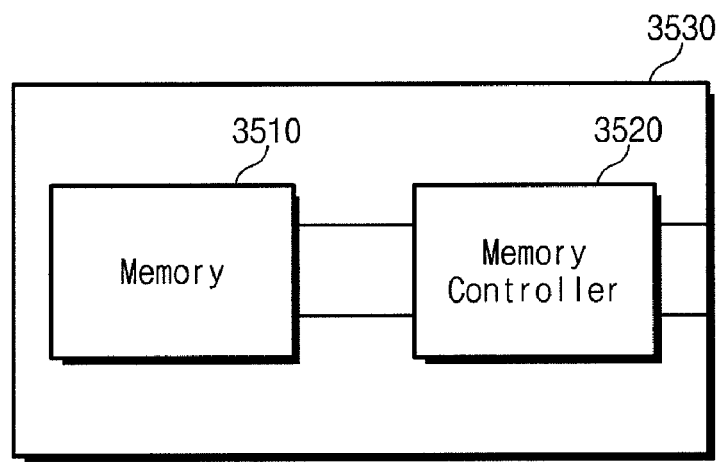
FIG. 19 is a block diagram of a memory system 3530 according to various embodiment of the present invention.

FIG. 19 is a block diagram of a memory system 3530 according to another exemplary embodiment of the present invention.

The memory system 3530 shown in FIG. 19 is implemented as a memory card comprising a memory 3510 and a memory controller 3520. For instance, the memory card 3530 may be a flash memory card. In other words, the memory card 3530 may be conform to an industrial standard (e.g., SD/MMC, compact flash, etc.) for use in an electronic apparatus such as digital camera or personal computer. It is also understood by those skilled in the art that the memory controller 3520 is able to control the memory 3510 in response to control signals received from a host system (e.g., external system) connected to the card 3530.

Figure 20:
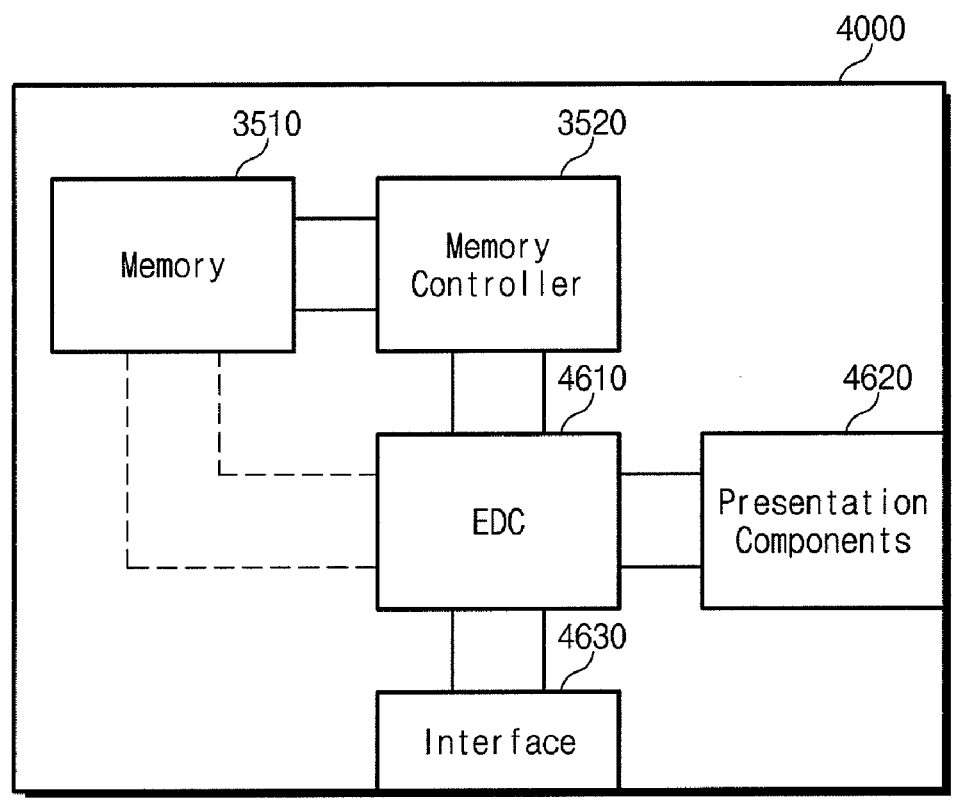
FIG. 20 is a block diagram of a memory system 4000 according to various embodiments of the present invention.

FIG. 20 is a block diagram of a memory system 4000 according to another exemplary embodiment of the present invention.

The memory system 4000 shown in FIG. 20 implements a portable system 4000. The portable system 4000 may be an MP3 player, a video player, a combination video/audio player, or so on. As shown in FIG. 20, the portable system 4000 includes a memory 3510 and a memory controller 3520. The portable system 4000 may further include an encoder/decoder 4610, information presentation components 4620, and an input/output interface 4630.

Data (video, audio, etc.) processed by the encoder/decoder (EDC) 4610 can be input to the memory 3510, through the memory controller 3520, and output from the memory 3510 through an encoder/decoder circuit EDC 4610. As illustrated by dotted lines in FIG. 20, data can be input directly into the memory 3520 from the EDC 4610 and/or output directly into the EDC 4610 from the memory 3510.

The EDC 4610 is able to encode data in order to store the encoded data into the memory 3510. For instance, the EDC 4610 is able to perform an MP3 encoding operation with audio data in order to store the data in the memory 3510. In another application, the EDC 4610 is able to perform an MPEG encoding operation (e.g., MPEG2, MPEG4, etc.) with video data in order to store the data in the memory 3510. Further, the EDC 4610 may include a plurality of encoders for encoding data of other types in accordance with other data formats. For example, the EDC 4610 may include an MP3 encoder/decoder for audio data and an MPEG encoder/decoder for video data.

The EDC 4610 is able to decode an output of the memory 3510. For instance, the EDC 4610 is able to perform an MP3 decoding operation with audio data output from the memory 3510. In another application, the EDC 4610 is able to perform an MPEG decoding operation (e.g., MPEG2, MPEG4, etc.) with video data output from the memory 3510. Further, the EDC 4610 may include a plurality of decoders for decoding data of other types in accordance with other data formats.

It can be also understood that the EDC 4610 may include decoders only. For example, previously encoded data can be received by the EDC 4610 and passed through the memory controller 3520 and/or the memory 3510.

The EDC 4610 is able to receive raw data for encoding by way of the interface 4630 or to receive previously encoded data. The interface 4630 may conform to a known standard (e.g., firmware, USB, etc.). The interface 4630 may further include more one interface units. For instance, the interface 4630 may include a firmware interface, a USB interface, and so on. Data from the memory 3510 may be even output by way of the interface 4630.

The presentation components 4620 are able to display data output from the memory and/or decoded by the EDC 4610. For instance, the presentation components 4620 may include a speaker jack for outputting audio data, a display screen for outputting video data, and so on.

The flash memory device 3510 and/or the memory controller 3520 according to embodiments of the present invention can be mounted on the aforementioned portable system as various types of packages. For instance, the flash memory 3510 and/or the memory controller 3520 may be placed thereon by any package type, e.g., Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP).

The above-disclosed subject matter is to be considered illustrative, and not restrictive, and the appended claims are intended to cover all such modifications, enhancements, and various other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description of exemplary embodiments.

What is claimed is:

1. A memory structure comprising:
    a first source line among a first plurality of source lines formed in a first level;
    a first bit line among a first plurality of bit lines formed in a second level; and
    a first plurality of memory cell strings connected between the first source line and the first bit line and formed between the first level and the second level;
    wherein each source line is driven by the same voltage as the corresponding bit line and a channel of each of the connected memory cell strings is precharged from both ends of the channel in a programming operation.

2. The memory structure of claim 1, further comprising:
a second source line formed in a third level over the first level and over the second level; and
a second plurality of memory cell strings connected between the first bit line and the second source line and formed between the second level and the third level.

3. The memory structure of claim 1, wherein each memory cell string comprises a first selection transistor, a second selection transistor, and m memory cells serially connected between the first and second selection transistors, wherein each of the m memory cells of each memory cell string is driven by one of m wordlines, wherein each of the m wordlines is formed in a different one of m metallization levels formed between the first level and the second level.

4. The memory structure of claim 1, further comprising:
a semiconductor substrate,
wherein the first source line is formed in the first level in the semiconductor substrate,
wherein the first bit line is formed in the second level on the semiconductor substrate, and
wherein the first source lines comprise an N-type material formed in the semiconductor substrate.

5. The memory structure of claim 1, further comprising:
a semiconductor substrate,
wherein the source lines comprise a metal, wherein the first source line is formed in the first level on the semiconductor substrate.

6. The memory structure of claim 1, wherein each bit line is driven at a voltage based on data, while driving each source line in a predetermined voltage, during a programming operation.

7. A nonvolatile semiconductor memory device comprising:
a memory array including:
a first plurality of source lines formed in a first level over a substrate;
a first plurality of bit lines formed in a second level over the substrate; and
a first plurality of memory cell strings formed between the first level and the second level and electrically connected between pairs of the bit lines and source lines; and
a reading/writing circuit configured to drive the first plurality of bit lines and the first plurality of source lines in accordance with data to be stored in the memory device during a programming operation;
wherein each source line is driven by the same voltage as the corresponding bit line and a channel of a corresponding memory cell string is precharged from both ends of the channel during the programming operation.

8. The device of claim 7, wherein the reading/writing circuit comprises:
bit-line driving/sensing circuits connected to the first plurality of bit lines; and
source-line driving circuits corresponding each to the bit-line driving/sensing circuits and connected to the first plurality of source lines, and driving the corresponding source lines in accordance with data stored in the corresponding bit-line driving/sensing circuit during the programming operation.

9. The device of claim 7, wherein each source line among the first plurality of source lines is driven by the same one of a program voltage or a program-inhibition voltage as its corresponding bit line, and
wherein the reading/writing circuit comprises:
bit-line driving/sensing circuits corresponding to the first plurality of bit lines and the first plurality of source lines, each bit-line driving/sensing circuit driving the corresponding source line with the same voltage as the corresponding bit line through a switch during the programming operation; and
a source-line driving circuit corresponding to each of the source lines and driving the corresponding source line during a reading operation.

10. The device of claim 7, further comprising:
the substrate, wherein the first plurality of bit lines are formed over the first source line;
a second plurality of source lines formed in a third level over the first level and over the second level; and
a second plurality of memory cell strings formed between the second level and the third level and electrically connected between the first plurality of bit lines and the second plurality of source lines.

11. The device of claim 7, wherein each memory cell string comprises a first selection transistor, a second selection transistor, and m memory cells serially connected between the first and second selection transistors.

12. The device of claim 7, further comprising a second plurality of memory cell strings vertically formed being formed over the first level and over the second level, wherein each of the memory cell strings among the second plurality of memory cell strings is stacked over a corresponding one of the memory cell strings among the first plurality of memory cell strings,
wherein the first plurality of memory cell strings are vertically formed, and
wherein each pair of the stacked first and second vertically formed memory cell strings shares one of the source lines or one of the bit lines.

13. The device of claim 7, wherein the number of bit lines in the first plurality of bit lines is the same as the number of source lines in the first plurality of source lines.

14. A memory system comprising a nonvolatile semiconductor memory device of claim 7; and a memory controller configured to control the nonvolatile semiconductor memory device.

15. A computer system comprising a nonvolatile semiconductor memory device including:
a first bit line formed in a first level over a substrate;
a second bit line formed in a third level over the substrate;
a first source line formed in a second level over the substrate.; and
a first plurality of memory cell strings formed between the first level and the second level and electrically connected between the first bit line and the first source line;
wherein the first source line is driven by the same one of a program voltage or a program-inhibition voltage as the first bit line during a programming operation.

16. The computer system of claim 15, wherein the nonvolatile semiconductor memory device further includes:
a second plurality of memory cell strings formed between the second level and the third level and electrically connected between the first source line and the second bit line.

17. The computer system of claim 15, wherein the first source line and the first bit line and the second bit line are formed in the same plane.

* * * * *